(12) United States Patent
Wang et al.

(10) Patent No.: US 11,069,274 B2
(45) Date of Patent: Jul. 20, 2021

(54) SHIFT REGISTER UNIT, GATE DRIVING CIRCUIT, DRIVING METHOD AND DISPLAY APPARATUS

(71) Applicant: BOE Technology Group Co., Ltd., Beijing (CN)

(72) Inventors: Zhichong Wang, Beijing (CN); Seungwoo Han, Beijing (CN); Guangliang Shang, Beijing (CN); Haoliang Zheng, Beijing (CN); Lijun Yuan, Beijing (CN); Xing Yao, Beijing (CN); Mingfu Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 30 days.

(21) Appl. No.: 16/497,199

(22) PCT Filed: Apr. 12, 2019

(86) PCT No.: PCT/CN2019/082438
§ 371 (c)(1),
(2) Date: Sep. 24, 2019

(87) PCT Pub. No.: WO2019/205962
PCT Pub. Date: Oct. 31, 2019

(65) Prior Publication Data
US 2020/0388201 A1  Dec. 10, 2020

(30) Foreign Application Priority Data

Apr. 26, 2018 (CN) .......................... 201810385925.0

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2300/0426* (2013.01);
(Continued)

(58) Field of Classification Search
CPC ............. G09G 3/20; G09G 2310/0283; G09G 2310/08; G09G 2310/0286; G09G 2310/0267; G09G 2300/0426; G11C 19/28
See application file for complete search history.

(56) References Cited

U.S. PATENT DOCUMENTS 9,257,084 B2    2/2016  Cao et al.
9,786,240 B2   10/2017  Zhao et al.
(Continued)

FOREIGN PATENT DOCUMENTS

CN    102842278 A  * 12/2012
CN    102842278 A    12/2012
(Continued)

*Primary Examiner* — Alexander Eisen
*Assistant Examiner* — Kebede T Teshome
(74) *Attorney, Agent, or Firm* — Westman, Champlin & Koehler, P.A.

(57) ABSTRACT

The embodiments of the present application provide a shift register unit and a method for driving the same, a gate driving circuit, and a display apparatus. Here, the shift register unit includes a first controlling sub-circuit, a first voltage dividing sub-circuit, a charging and discharging sub-circuit, and an outputting sub-circuit. Here, an output signal of the outputting sub-circuit is controlled by the charging and discharging sub-circuit. A first input signal and a second input signal input at a first input signal terminal Forward and a second input signal terminal Backward electrically coupled to the charging and discharging sub-circuit are pulse signals.

14 Claims, 8 Drawing Sheets

(52) U.S. Cl.
CPC ............... *G09G 2310/0267* (2013.01); *G09G 2310/0283* (2013.01); *G09G 2310/0286* (2013.01); *G09G 2310/08* (2013.01)

(56) References Cited

U.S. PATENT DOCUMENTS

| | | | |
|---|---|---|---|
| 2008/0278214 A1 * | 11/2008 | Yoon | G09G 3/3677 |
| | | | 327/379 |
| 2015/0255031 A1 | 9/2015 | Cao et al. | |
| 2017/0004796 A1 | 1/2017 | Zhao et al. | |
| 2017/0186393 A1 * | 6/2017 | Wang | G09G 3/36 |

FOREIGN PATENT DOCUMENTS

| | | | | |
|---|---|---|---|---|
| CN | 103065592 A | 4/2013 | | |
| CN | 103489484 A | 1/2014 | | |
| CN | 104282255 A | 1/2015 | | |
| CN | 105096853 A | 11/2015 | | |
| CN | 105609040 A | 5/2016 | | |
| CN | 108538237 A | 9/2018 | | |
| KR | 20050014376 A | 2/2005 | | |
| KR | 20130010714 A | 1/2013 | | |
| WO | WO-2016161726 A1 * | 10/2016 | | G09G 3/36 |

\* cited by examiner

SHIFT REGISTER UNIT, GATE DRIVING CIRCUIT, DRIVING METHOD AND DISPLAY APPARATUS

CROSS-REFERENCE TO RELATED APPLICATION(S)

This application corresponding to PCT application PCT/CN2019/082438, which claims priority to the Chinese Patent Application No. 201810385925.0, filed on Apr. 26, 2018, which is incorporated herein by reference in its entirety.

TECHNICAL FIELD

Embodiments of the present disclosure relate to the field of display, and more particularly, to a shift register unit and a method for driving the same, a gate driving circuit, and a display apparatus.

BACKGROUND

In a display apparatus, a gate driving circuit may comprise multiple stages of shift register units GOA, wherein each stage of shift register unit drives one row of pixels. As the size of the display panel increases, it may not be ensured that a voltage at each node in the shift register units is stable, which influences normal output of the GOA units, thereby affecting the display quality of the display apparatus.

SUMMARY

The embodiments of the present disclosure provide a shift register unit and a method for driving the same, a gate driving circuit, and a display apparatus.

According to an aspect of the embodiments of the present disclosure, there is provided a shift register unit, comprising:

a first controlling sub-circuit configured to receive a first voltage signal and write the first voltage signal to a first node under a control of the first voltage signal, and receive a second voltage signal and write a second voltage signal to a second node under a control of the second voltage signal;

a first voltage dividing sub-circuit electrically coupled to the first controlling sub-circuit and an outputting signal terminal, and configured to receive an outputting signal from the outputting signal terminal, write a third voltage signal to the first node under a control of the outputting signal; and write the third voltage signal to the second node under the control of the outputting signal;

a charging and discharging sub-circuit electrically coupled to the first controlling sub-circuit, the first voltage dividing sub-circuit, a first inputting signal terminal and a second inputting signal terminal, and configured to receive a first clock signal, and write a first inputting signal from the first inputting signal terminal to a third node or receive a second inputting signal from the second inputting signal terminal to the third node, under a control of the first clock signal, a voltage at the first node, and a voltage at the second node; and an outputting sub-circuit electrically coupled to the charging and discharging sub-circuit and the outputting signal terminal, and configured to output a second clock signal at the outputting signal terminal under a control of the voltage at the third node.

In an example, the first controlling sub-circuit comprises a first transistor and a second transistor, wherein a gate of the first transistor and a first electrode of the first transistor are electrically coupled to a first voltage signal terminal for providing the first voltage signal, and a second electrode of the first transistor is electrically coupled to the first node; and a gate of the second transistor and a first electrode of the second transistor are electrically coupled to a second voltage signal terminal for providing the second voltage signal, and a second electrode of the second transistor is electrically coupled to the second node.

In an example, the first voltage dividing sub-circuit comprises a third transistor and a fourth transistor, wherein a gate of the third transistor is electrically coupled to the outputting signal terminal, a first electrode of the third transistor is electrically coupled to the first node, and a second electrode of the third transistor is electrically coupled to a third voltage signal terminal for providing the third voltage signal; and a gate of the fourth transistor is electrically coupled to the outputting signal terminal, a first electrode of the fourth transistor is electrically coupled to the second node, and a second electrode of the fourth transistor is electrically coupled to the third voltage signal terminal.

In an example, the charging and discharging sub-circuit comprises a forward charging and discharging sub-circuit, and a reverse charging and discharging sub-circuit, wherein the forward charging and discharging sub-circuit comprises a fifth transistor and a sixth transistor, wherein a gate of the fifth transistor is electrically coupled to a first clock signal terminal for providing a first clock signal, a first electrode of the fifth transistor is electrically coupled to the first inputting signal terminal, and a second electrode of the fifth transistor is electrically coupled to a first electrode of the sixth transistor; and a gate of the sixth transistor is electrically coupled to the first node, and a second electrode of the sixth transistor is electrically coupled to the third node; and wherein the reverse charging and discharging sub-circuit comprises a seventh transistor and an eighth transistor, wherein a gate of the seventh transistor is electrically coupled to the first clock signal terminal, a first electrode of the seventh transistor is electrically coupled to the second inputting signal terminal, and a second electrode of the seventh transistor is electrically coupled to a first electrode of the eighth transistor; and a gate of the eighth transistor is electrically coupled to the second node, and a second electrode of the eighth transistor is electrically coupled to the third node.

In an example, the outputting sub-circuit comprises a first capacitor and a ninth transistor. A first electrode of the first capacitor is electrically coupled to the third node, and a second electrode of the first capacitor is electrically coupled to the outputting signal terminal; and a gate of the ninth transistor is electrically coupled to the third node, a first electrode of the ninth transistor is electrically coupled to a second clock signal terminal for providing a second clock signal, and a second electrode of the ninth transistor is electrically coupled to the outputting signal terminal.

In an example, the shift register unit further comprises: a first noise reduction sub-circuit configured to write the third voltage signal to the outputting signal terminal under the control of the voltage at the first node or the voltage at the second node.

In an example, the first noise reduction sub-circuit comprises a tenth transistor and an eleventh transistor, wherein a gate of the tenth transistor is electrically coupled to the first node, a first electrode of the tenth transistor is electrically coupled to the outputting signal terminal, and a second electrode of the tenth transistor is electrically coupled to the third voltage signal terminal; and a gate of the eleventh transistor is electrically coupled to the second node, a first electrode of the eleventh transistor is electrically coupled to the outputting signal terminal, and a second electrode of the eleventh transistor is electrically coupled to the third voltage signal terminal.

In an example, the shift register unit further comprises: a second controlling sub-circuit, a second voltage dividing sub-circuit and a second noise reduction sub-circuit, wherein the second controlling sub-circuit is configured to receive the first voltage signal and write the first voltage signal to a fourth node under the control of the first voltage signal; and receive the second voltage signal and write the second voltage signal to a fifth node under a control of the second voltage signal;

the second voltage dividing sub-circuit is configured to receive a third voltage signal, write the third voltage signal to the fourth node under the control of the voltage at the third node, and write the third voltage signal to the fifth node under a control of the voltage at the third node; and the second noise reduction sub-circuit is configured to write the third voltage signal to the third node under a control of the voltage at the fourth node or a voltage at the fifth node.

The embodiments of the present disclosure further provide a gate driving circuit, comprising: N stages of shift register units according to the embodiments of the present disclosure; wherein the first inputting signal terminal of the $n^{th}$ stage of shift register unit is electrically coupled to the outputting signal terminal of the $(n-1)^{th}$ stage of shift register unit, and the second inputting signal terminal of the $n^{th}$ stage of shift register unit is electrically coupled to the outputting signal terminal of the $(n+1)^{th}$ stage of shift register unit, N is an integer greater than or equal to 4, and n is an integer greater than 1 and less than N.

The embodiments of the present disclosure further provide a display apparatus comprising the gate driving circuit according to the embodiments of the present disclosure.

The embodiments of the present disclosure further provide a method for driving the shift register unit according to the embodiments of the present disclosure, comprising:

during a first period, writing, by the first controlling sub-circuit, the first voltage dividing sub-circuit, and the charging and discharging sub-circuit, the first inputting signal or the second inputting signal to the third node, under the control of the first inputting signal or the second inputting signal; and during a second period, controlling, by the outputting sub-circuit, the outputting signal terminal to output the second clock signal under the control of the voltage at the third node.

BRIEF DESCRIPTION OF THE ACCOMPANYING DRAWINGS

In order to more clearly illustrate the technical solutions according to the embodiments of the present disclosure, the accompanying drawings required to be used in the description of the embodiments of the present disclosure will be briefly described below. Obviously, the accompanying drawings in the following description are only some of the embodiments of the present disclosure, and those of ordinary skill in the art may obtain other accompanying drawings according to the accompanying drawings without any creative work.

DETAILED DESCRIPTION

In order to make the above purposes, features and advantages of the embodiments of the present disclose more apparent and understandable, the present disclosure will be further described in detail below in conjunction with accompanying drawings and specific embodiments.

Figure 1:
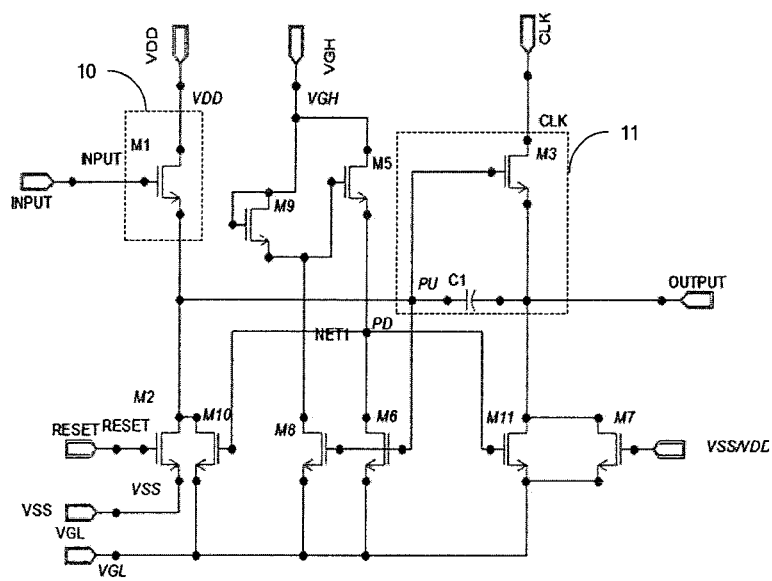
FIG. 1 illustrates a schematic structural diagram of a bidirectional scanning GOA unit.

FIG. 1 illustrates a schematic structural diagram of a bidirectional scanning shift register unit. As shown in FIG. 1, one terminal of a charging and discharging circuit 10, that is, a first electrode of a first transistor M1, is directly coupled to a direct current voltage terminal VDD. VDD is at a high level during forward scanning and VDD is at a low level during reverse scanning, which causes an active layer of the transistor M1 in the charging and discharging circuit 10 to be subjected to stress for a long time, thereby resulting in that a negative offset of a threshold voltage Vth of M1 easily occurs. Therefore, the transistor M1 is prone to generate leakage current, which affects a voltage at a point PU, thereby affecting maintenance of a voltage of an output signal at an output signal terminal Output. For example, after forward scanning for a long time, a negative offset of Vth of the first transistor M1 occurs, and when the forward scanning is switched to reverse scanning, the voltage at the point PU may not be maintained due to the electricity leakage of M1, which results in that a third transistor M3 in an output module 11 may not be turned on, thereby affecting normal output of the shift register unit.

In the embodiments of the present disclosure, since a source and a drain of a switching transistor used are symmetrical, the source and the drain of the switching transistor are interchangeable. In the embodiments of the present disclosure, a gate may be referred to as a control electrode, one of a source and a drain may be referred to as "a first electrode", and the other of the source and the drain may be referred to as "a second electrode", depending on functions thereof. In the following examples, a description will be given by taking switching transistors being N-type thin film transistors as an example. It may be understood by those skilled in the art that the embodiments of the present disclosure are obviously applicable to a case where the switching transistors are P-type thin film transistors. The "first electrode" is a source, and the "second electrode" is a drain. Of course, the "first electrode" may also be a drain and the "second electrode" may also be a source.

Figure 2A:
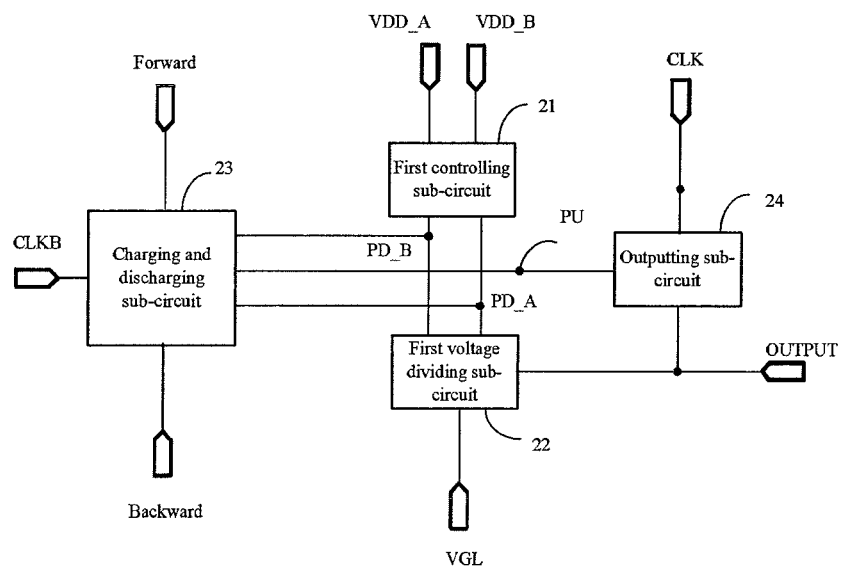
FIG. 2A illustrates an exemplary structural block diagram of a shift register unit according to an embodiment of the present disclosure.

The embodiments of the present disclosure provide a shift register unit. As shown in FIG. 2A, the shift register unit may comprise a first controlling sub-circuit 21, a first voltage dividing sub-circuit 22, a charging and discharging sub-circuit 23, and an outputting sub-circuit 24.

The first controlling sub-circuit 21 may be electrically coupled to a first voltage signal input terminal VDD_A, a second voltage signal input terminal VDD_B, a first node PD_A and a second node PD_B. The first controlling sub-circuit 21 is configured to write a first voltage signal at the first voltage signal input terminal VDD_A to the first node PD_A under a control of the first voltage signal at the first voltage signal input terminal VDD_A; and write a second voltage signal at the second voltage signal input terminal VDD_B to the second node PD_B under a control of the second voltage signal at the second voltage signal input terminal VDD_B.

The first voltage dividing sub-circuit 22 is electrically coupled to the first controlling sub-circuit 21, an output signal terminal Output, a third voltage signal input terminal VGL, the first node PD_A and the second node PD_B respectively, and is configured to write a third voltage signal at the third voltage signal input terminal VGL to the first node PD_A and write the third voltage signal to the second node PD_B under a control of an output signal at the output signal terminal Output.

The charging and discharging sub-circuit 23 is electrically coupled to the first controlling sub-circuit 21, the first voltage dividing sub-circuit 22, a first input signal terminal Forward, a second input signal terminal Reverse, the first node PD_A, the second node PD_B, a first clock signal input terminal CLKB and a third node PU respectively. The charging and discharging sub-circuit 23 is configured to write a voltage at the first input signal terminal Forward to the third node PU or write a voltage at the second input signal terminal Reverse to the third node PU under a control of a voltage at the first node PD_A and a voltage at the second node PD_B.

The outputting sub-circuit 24 is electrically coupled to the charging and discharging sub-circuit 23, the third node PU, a second clock signal input terminal CLK and the output signal terminal Output respectively, and is configured to output a second clock signal from the second clock signal input terminal CLK at the output signal terminal Output under a control of a voltage at the third node PU.

Figure 8:
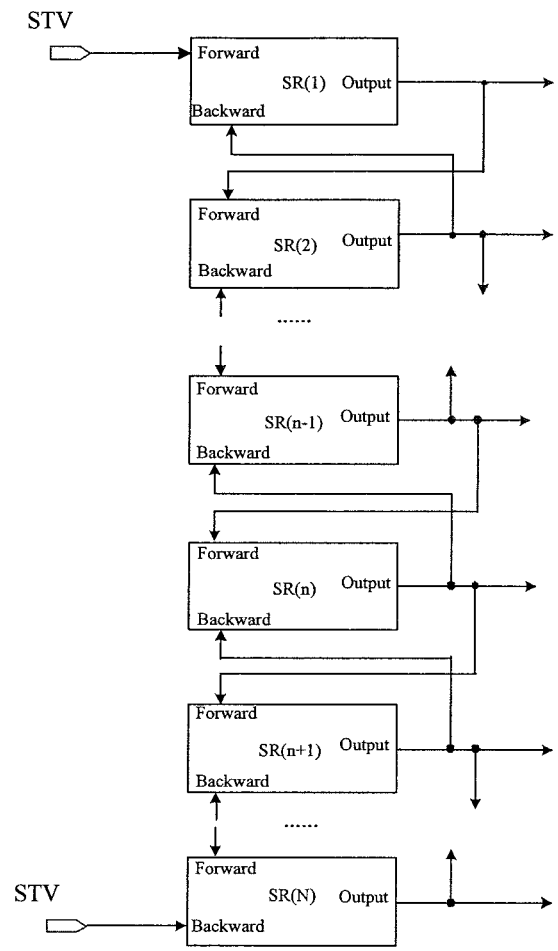
FIG. 8 illustrates a schematic structural diagram of a gate driving circuit according to an embodiment of the present disclosure.

According to an embodiment of the present disclosure, a first input signal Forward or a second input signal Reverse is used as an input signal of the charging and discharging sub-circuit 23 by the first controlling sub-circuit 21 under a control of a first voltage signal VDD_A and a second voltage signal VDD_B respectively, which in turn controls the shift register unit to perform forward scanning or reverse scanning. As shown in FIG. 8, for a current stage of shift register unit $SR_n$, an output signal terminal Output of a previous stage of shift register unit $SR_{n-1}$ is electrically coupled to a first input signal terminal Forward of the shift register unit $SR_n$, and an output signal terminal Output of a next stage of shift register unit $SR_{n+1}$ is electrically coupled to a second input signal terminal Reverse of the shift register unit $SR_n$. When the forward scanning is performed, an output signal of the previous stage of shift register unit $SR_{n-1}$ is used as an input signal of a charging and discharging sub-circuit 23 of the shift register unit $SR_n$. When the reverse scanning is performed, an output signal of the next stage of shift register unit $SR_{n+1}$ is used as the input signal of the charging and discharging sub-circuit 23 of the shift register unit $SR_n$.

Figure 2B:
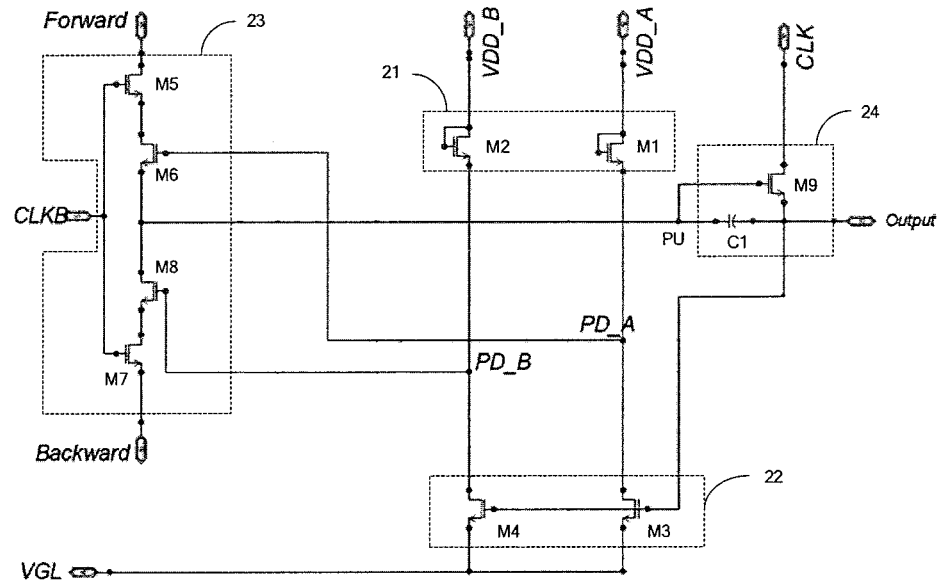
FIG. 2B illustrates an exemplary structural diagram of a shift register unit according to an embodiment of the present disclosure.

FIG. 2B illustrates an exemplary structural diagram of a shift register unit according to an embodiment of the present disclosure. As shown in FIG. 2B, the first controlling sub-circuit 21 may comprise a first transistor M1 and a second transistor M2. The first transistor M1 has a gate and a first electrode electrically coupled to a first voltage signal terminal for providing the first voltage signal VDD_A respectively, and a second electrode electrically coupled to the first node PD_A; and the second transistor M2 has a gate and a first electrode electrically coupled to a second voltage signal terminal for providing the second voltage signal VDD_B respectively, and a second electrode electrically coupled to the second node PD_B.

The first voltage dividing sub-circuit 22 may comprise a third transistor M3 and a fourth transistor M4. The third transistor M3 has a gate electrically coupled to the output signal terminal Output, a first electrode electrically coupled to the first node PD_A, and a second electrode electrically coupled to a third voltage signal terminal for providing the third voltage signal VGL; and the fourth transistor M4 has a gate electrically coupled to the output signal terminal Output, a first electrode electrically coupled to the second node PD_B, and a second electrode electrically coupled to the third voltage signal terminal.

The charging and discharging sub-circuit 23 may comprise a forward charging and discharging sub-circuit and a reverse charging and discharging sub-circuit. The forward charging and discharging sub-circuit is configured to write a voltage of the first input signal Forward to the third node PU under a control of a voltage of the first clock signal CLKB and the voltage at the first node PD_A. The forward charging and discharging sub-circuit comprises a fifth transistor M5 and a sixth transistor M6. The fifth transistor M5 has a gate electrically coupled to the first clock signal terminal for providing the first clock signal CLKB, a first electrode electrically coupled to the first input signal terminal Forward, and a second electrode electrically coupled to a first electrode of the sixth transistor M6. The sixth transistor M6 has a gate electrically coupled to the first node PD_A, and a second electrode electrically coupled to the third node PU. The reverse charging and discharging sub-circuit is configured to write the second input signal Reverse to the third node PU under a control of the voltage of the first clock signal CLKB and the voltage at the second node PD_B. The reverse charging and discharging sub-circuit comprises a seventh transistor M7 and an eighth transistor M8. The seventh transistor M7 has a gate electrically coupled to the first clock signal terminal CLKB, a first electrode electrically coupled to the second input signal terminal Reverse, and a second electrode electrically coupled to a first electrode of the eighth transistor M8; and the eighth transistor M8 has a gate electrically coupled to the second node PD_B, and a second electrode electrically coupled to the third node PU.

The outputting sub-circuit 24 may comprise a first capacitor C1 and a ninth transistor M9. The first capacitor C1 has a first electrode electrically coupled to the third node PU, and a second electrode electrically coupled to the output signal terminal Output; and the ninth transistor M9 has a gate electrically coupled to the third node PU, a first electrode electrically coupled to the second clock signal terminal for providing the second clock signal CLK, and a second electrode electrically coupled to the output signal terminal Output.

Figure 3A:
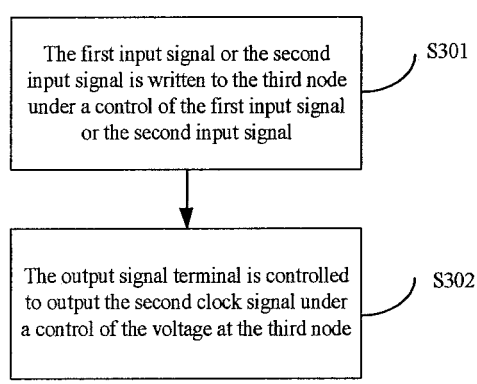
FIG. 3A illustrates a flowchart of a method for driving a shift register unit according to an embodiment of the present disclosure.

Another embodiment of the present application further provides a driving method applied to the shift register unit according to the embodiment of the present disclosure. As shown in FIG. 3A, the driving method 30 may comprise the following steps.

In step S301, during a first period, the first input signal or the second input signal is written to the third node under a control of the first input signal or the second input signal.

For example, this step may be performed by the first controlling sub-circuit, the first voltage dividing sub-circuit, and the charging and discharging sub-circuit.

In step S302, during a second period, the output signal terminal is controlled to output the second clock signal under a control of the voltage at the third node.

For example, this step may be performed by the outputting sub-circuit.

By taking the forward scanning as an example, during the first period, the first controlling sub-circuit 21 writes the first voltage signal to the first node PD_A under the control of the first voltage signal VDD_A. At the same time, the charging and discharging sub-circuit 23 writes the first input signal Forward to the third node PU under the control of the voltage of the first clock signal CLKB and the voltage at the first node PD_A. Therefore, the first input signal Forward is used as an input signal of the shift register unit at this time. The first period may be referred to as an "input period".

During the second period, the outputting sub-circuit 24 outputs the second clock signal CLK at the output signal terminal Output under the control of the voltage at the third node PU. At the same time, the first voltage dividing sub-circuit 22 writes the third voltage signal VGL to the first node PD_A under the control of the voltage at the output signal terminal Output. The second period may be referred to as an "output period".

After the second period, the charging and discharging sub-circuit 23 may further write the first input signal Forward to the third node PU under the control of the voltage of the first clock signal and the voltage at the first node PD_A to realize the resetting of the third node PU.

By taking the reverse scanning as an example, during the first period, the first controlling sub-circuit 21 writes the second voltage signal to the second node PD_B under the control of the second voltage signal VDD_B; and at the same time, the charging and discharging sub-circuit 23 writes the second input signal Reverse to the third node PU under the control of the voltage of the first clock signal CLKB and the voltage at the second node PD_B. Therefore, the second input signal Reverse is used as the input signal of the shift register unit at this time.

During the second period, the outputting sub-circuit 24 outputs the second clock signal CLK at the output signal terminal Output under the control of the voltage at the third node PU; and at the same time, the first voltage dividing sub-circuit 22 writes the third voltage signal VGL to the second node PD_B under the control of the output signal Output.

During a third period T3 after the second period, the charging and discharging sub-circuit 23 may further write the second input signal Reverse to the third node PU under the control of the voltage of the first clock signal CLK and the voltage at the second node PD_B to realize the resetting of the third node PU.

Therefore, according to an embodiment of the present disclosure, the driving method described above may further comprise the following operation.

During the third period T3, the first input signal or the second input signal is written to the third node to reset the third node.

For example, this step may be performed by the charging and discharging sub-circuit. During the forward scanning, the charging and discharging sub-circuit controls to write the first input signal to the third node to reset the third node. During the reverse scanning, the charging and discharging sub-circuit controls to write the second input signal to the third node to reset the third node. Of course, for example, during the forward scanning, an output signal of a next stage of shift register unit may also be used as a reset signal of a previous stage of shift register unit, and during the reverse scanning, an output signal of the previous stage of shift register unit may also be used as a reset signal of the next stage of shift register unit etc., which is not specifically limited in the present application.

In practical applications, the gate driving circuit may comprise N stages of cascaded shift register units according to the embodiments of the present disclosure, where N is an integer greater than or equal to 4. For a first stage of shift register unit, a first input signal Forward may be, for example, a pulse signal such as a STV frame start signal etc. For an $n^{th}$ stage of shift register unit, where n is an integer greater than 1 and less than N, a first input signal Forward may be, for example, an output signal of an $(n-1)^{th}$ stage of shift register unit. For an $N^{th}$ stage of shift register unit, a second input signal Backward may be, for example, a pulse signal such as an STV frame start signal etc. In a display cycle of one frame, the STV signals and output signals of the respective stages of shift register units are all pulse signals. The pulse signals may, for example, be at a valid level, which is a high level, in a scanning period of one row. Thus, an active layer of a TFT in a charging and discharging sub-circuit 23 of each stage of shift register unit may not be subjected to stress for a long time, and a negative offset of a threshold voltage of the TFT may not occur, so that the voltage at the third node PU, that is, a gate voltage of the outputting sub-circuit 24, is maintained to be stable, thereby realizing normal output of the shift register unit.

Figure 3B:
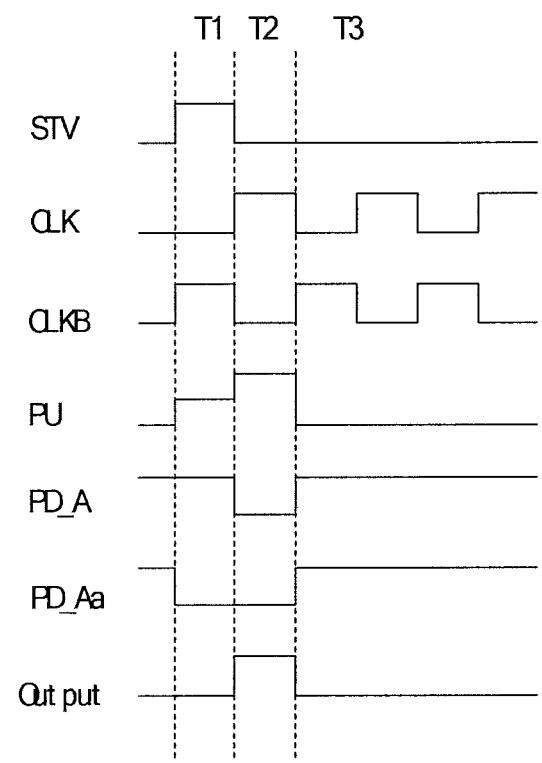
FIG. 3B illustrates a signal timing diagram of a shift register unit according to an embodiment of the present disclosure.
Figure 4:
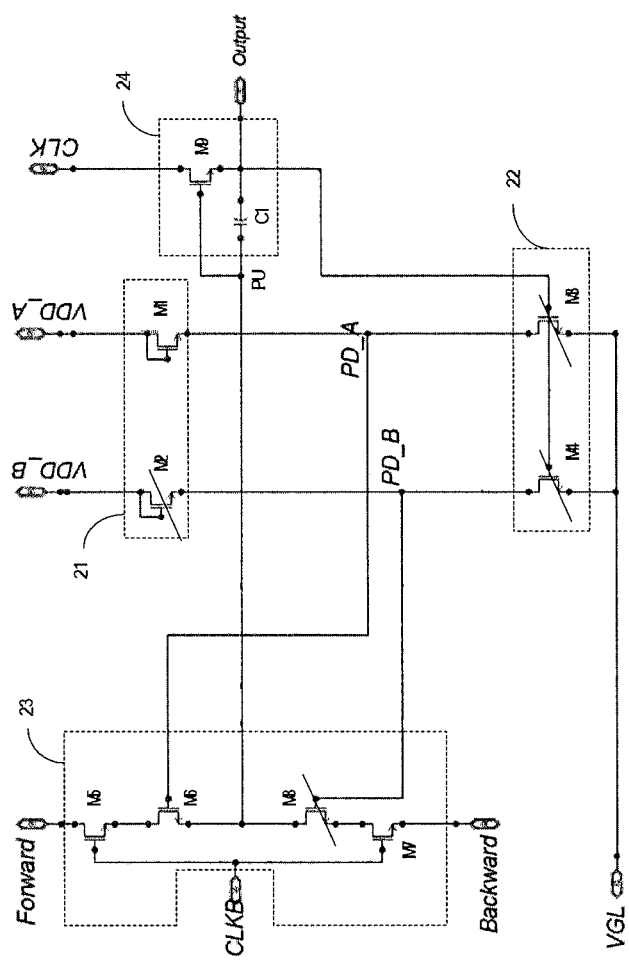
FIG. 4 illustrates an equivalent circuit diagram of a shift register unit during a first period according to an embodiment of the present disclosure.
Figure 5:
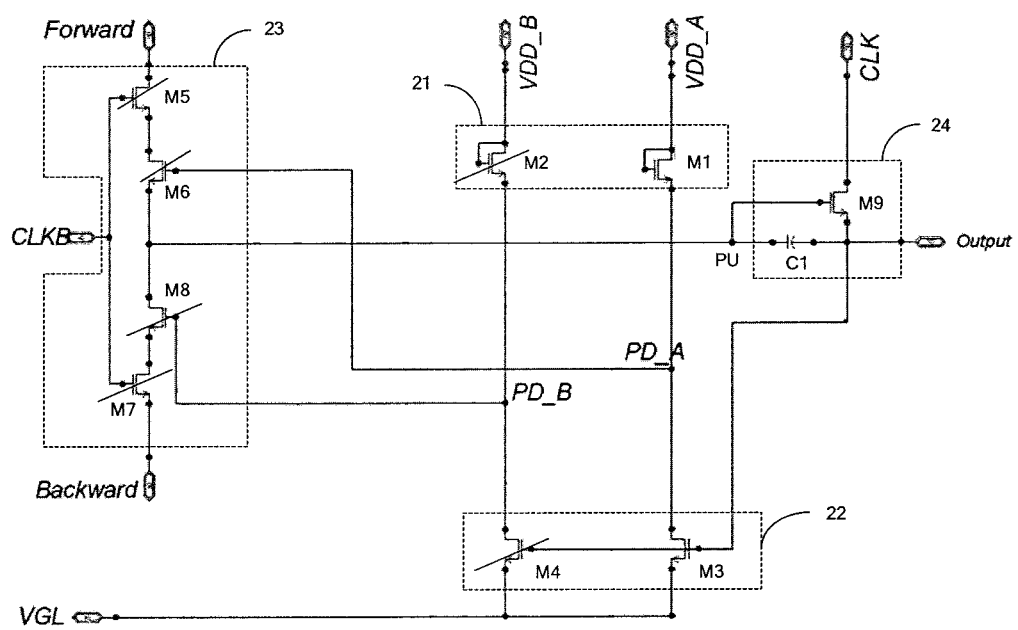
FIG. 5 illustrates an equivalent circuit diagram of a shift register unit during a second period according to an embodiment of the present disclosure.

FIG. 3B illustrates a signal timing diagram of driving a gate to perform forward scanning in one cycle. It may be understood by those skilled in the art that in a case where the shift register unit is the first stage of shift register unit, the first input signal Forward may be an STV signal, and in a case where the shift register unit is the $N^{th}$ stage of shift register unit, the second input signal Backward may be an STV signal. FIG. 4 illustrates an equivalent circuit diagram of a shift register unit during a first period according to an embodiment of the present disclosure, and FIG. 5 illustrates an equivalent circuit diagram of a shift register unit during a second period according to an embodiment of the present disclosure. An operation timing of the shift register unit according to the embodiment of the present disclosure will be described below with reference to FIGS. 2A, 2B, 3A, 3B, 4, and 5.

A process and principle of the shift register unit driving the gate to perform forward scanning according to the present embodiment will be described in detail below by taking all the transistors described above being N-type transistors as an example in combination with a timing of the respective input signals in this case.

During the forward scanning, the first voltage signal VDD_A is at a high level, the second voltage signal VDD_B is at a low level, the transistor M1 is turned on at this time, and the voltage at the first node PD_A is at a high level.

During a first period T1, since the voltage at the first node PD_A is at a high level, the sixth transistor M6 is controlled to be turned on, and since the first clock signal CLKB is at a high level at the same time, the fifth transistor M5 is also controlled to be turned on, and the first input signal Forward is written to the third node PU. Since the first input signal Forward is at a high level in the period T1, the voltage at the third node PU is at a high level in the period T1. Here, during the first period T1, although the voltage at the third node PU is at a high level and the ninth transistor M9 is controlled to be turned on, since the second clock signal CLK is at a low level, there is still no output at the output signal terminal Output. An equivalent circuit diagram of the shift register unit during the first period is as shown in FIG. 4.

During a second period T2, the first clock signal CLKB becomes a low level, and the fifth transistor M5 is controlled to be turned off. Since the second clock signal CLK is at a high level during the period T2, the voltage at the third node PU continues to increase under a bootstrap effect of the first capacitor C1, the ninth transistor M9 is controlled to be turned on, and therefore the output signal terminal Output outputs a second clock signal at a high level during the period T2. At the same time, since the output signal terminal Output outputs a high level, the third transistor M3 is controlled to be turned on, the third voltage signal VGL is written to the first node PD_A, and the voltage at the first node PD_A decreases due to the voltage division of the third transistor M3. An equivalent circuit diagram of the shift register unit during the second period is as shown in FIG. 5.

After the second period T2, there is no output at the output signal terminal Output, the third transistor M3 is turned off, that is, the voltage division of the third transistor M3 is eliminated, the voltage at the first node PD_A increases, and the sixth transistor M6 is controlled to be turned on. At the same time, the first clock signal CLKB is at a high level, the fifth transistor M5 is also controlled to be turned on, and therefore the first input signal Forward is written to the third node PU in this period. Since the first input signal Forward is at a low level during the period, the voltage at the third node PU is at a low level during this period to realize the resetting of the third node PU.

When the shift register unit according to the embodiment of the present disclosure is used for reverse scanning, it is only necessary to input a low level to the first voltage signal input terminal VDD_A and input a high level to the second voltage signal input terminal VDD_B, and at this time, the second input signal Reverse may be used as the input signal of the charging and discharging sub-circuit 23. For a specific operating process and principle, reference may be made to the above description of the forward scanning, and details thereof will not be described here again.

According to an embodiment of the present disclosure, since the first electrode of the fifth transistor is electrically coupled to the first input signal terminal Forward, the first electrode of the seventh transistor is electrically coupled to the second input signal terminal Reverse, and pulse signals are input at the first input signal terminal Forward and the second input signal terminal Reverse, the active layer of the TFT in the charging and discharging sub-circuit 23 may not be subjected to stress for a long time, and a negative offset of a threshold voltage of the TFT may not occur, so that the voltage at the third node PU, that is, a gate control voltage of the outputting sub-circuit 24, is maintained, thereby realizing normal output of the shift register unit.

Figure 6:
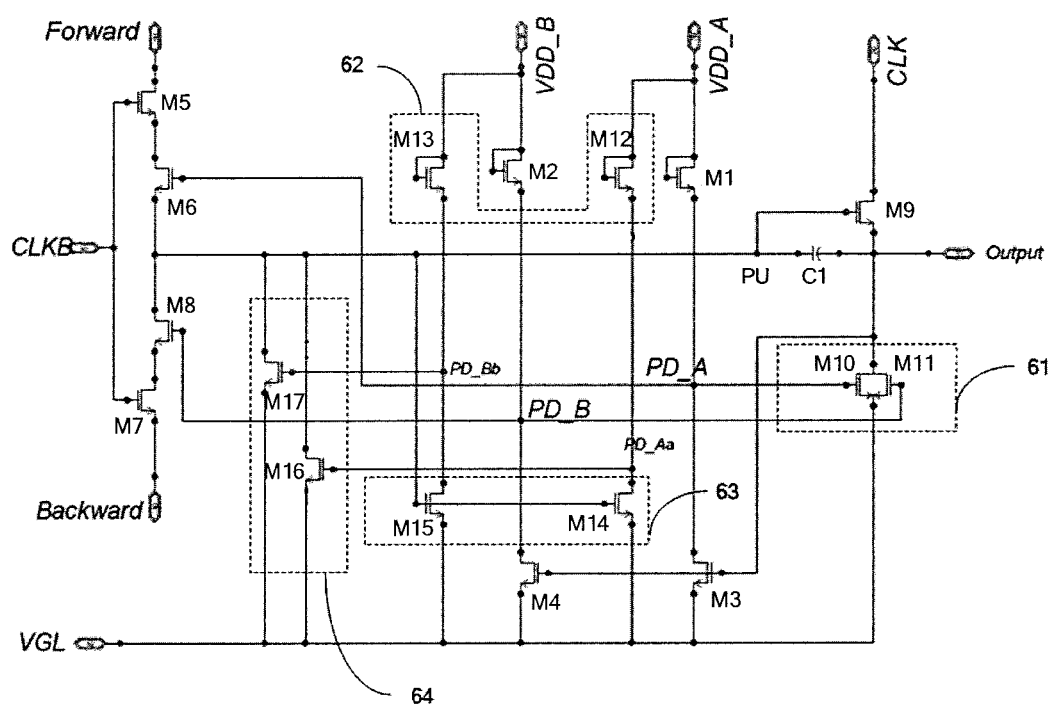
FIG. 6 illustrates a schematic structural diagram of another exemplary shift register unit according to an embodiment of the present disclosure.

In another embodiment of the present application, as shown in FIG. 6, the shift register unit may further comprise a first noise reduction sub-circuit 61, which is electrically coupled to the output signal terminal Output, the first node PD_A, the second node PD_B, and the third voltage signal input terminal VGL respectively. The first noise reduction sub-circuit 61 is configured to write the third voltage signal VGL to the output signal terminal Output under the control of the voltage at the first node PD_A or the voltage at the second node PD_B. The first noise reduction sub-circuit 61 is mainly used to write the third voltage signal VGL at a low level to the output signal terminal Output during a reset period after the first period and the second period, so as to perform noise reduction on the output signal terminal Output, thereby avoiding outputting a signal during a non-output period.

For example, the first noise reduction sub-circuit 61 may comprise a tenth transistor M10 and an eleventh transistor M11. The tenth transistor M10 has a gate electrically coupled to the first node PD_A, a first electrode electrically coupled to the output signal terminal Output, and a second electrode electrically coupled to receive the third voltage signal VGL; and the eleventh transistor M11 has a gate electrically coupled to the second node PD_B, a first electrode electrically coupled to the output signal terminal Output, and a second electrode electrically coupled to receive the third voltage signal VGL.

The forward scanning is still taken as an example for description. During the reset period after the input period T1 and the output period T2, the voltage at the first node PD_A is at a high level, the tenth transistor M10 is turned on, and therefore the third voltage signal VGL at a low level is written to the output signal terminal Output to perform noise reduction on the output signal terminal Output, so as to avoid outputting a signal during the non-output period.

In another embodiment of the present application, as shown in FIG. 6, the shift register unit may further comprise a second controlling sub-circuit 62, a second voltage dividing sub-circuit 63, and a second noise reduction sub-circuit 64.

The second controlling sub-circuit 62 is electrically coupled to the first voltage signal input terminal VDD_A, the second voltage signal input terminal VDD_B, a fourth node PD_Aa and a fifth node PD_Bb respectively, and is configured to write the first voltage signal VDD_A to the fourth node PD_Aa under the control of the first voltage signal VDD_A, and write the second voltage signal VDD_B to the fifth node PD_Bb under the control of the second voltage signal VDD_B.

The second voltage dividing sub-circuit 63 is electrically coupled to the third node PU, the fourth node PD_Aa, the fifth node PD_Bb, and the third voltage signal input terminal VGL respectively, and is configured to write the third voltage signal VGL to the fourth node PD_Aa and write the third voltage signal VGL to the fifth node PD_Bb under the control of the voltage at the third node PU.

The second noise reduction sub-circuit 64 is electrically coupled to the third node PU, the fourth node PD_Aa, the fifth node PD_Bb, and the third voltage signal input terminal VGL respectively, and is configured to write the third voltage signal VGL to the third node PU under a control of a voltage at the fourth node PD_Aa or the fifth node PD_Bb.

The second controlling sub-circuit 62 and the second voltage dividing sub-circuit 63 are mainly used to control the voltages written to the fourth node PD_Aa and the fifth node PD_Bb. The second noise reduction sub-circuit 64 is mainly used to write the third voltage signal VGL to the third node PU under the control of the voltage at the fourth node PD_Aa or the fifth node PD_Bb, to perform noise reduction on the third node PU, so as to prevent turn-on of the ninth transistor M9 due to pulse fluctuation at the third node PU, thereby avoiding outputting a signal during the non-output period.

For example, the second controlling sub-circuit 62 may comprise a twelfth transistor M12 and a thirteenth transistor M13. The twelfth transistor M12 has a gate and a first electrode electrically coupled to the first voltage signal input terminal VDD_A respectively, and a second electrode electrically coupled to the fourth node PD_Aa; and the thirteenth transistor M13 has a gate and a first electrode electrically coupled to the second voltage signal input terminal VDD_B respectively, and a second electrode electrically coupled to the fifth node PD_Bb.

The second voltage dividing sub-circuit 63 comprises a fourteenth transistor M14 and a fifteenth transistor M15. The fourteenth transistor M14 has a gate electrically coupled to the third node PU, a first electrode electrically coupled to the fourth node PD_Aa, and a second electrode electrically coupled to the third voltage signal input terminal VGL; and the fifteenth transistor M15 has a gate electrically coupled to the third node PU, a first electrode electrically coupled to the fifth node PD_Bb, and a second electrode electrically coupled to the third voltage signal input terminal VGL.

The second noise reduction sub-circuit 64 comprises a sixteenth transistor M16 and a seventeenth transistor M17. The sixteenth transistor M16 has a gate electrically coupled to the fourth node PD_Aa, a first electrode electrically coupled to the third node PU, and a second electrode electrically coupled to the third voltage signal input terminal VGL; and the seventeenth transistor M17 has a gate electrically coupled to the fifth node PD_Bb, a first electrode electrically coupled to the third node PU, and a second electrode electrically coupled to the third voltage signal input terminal VGL.

The forward scanning is still taken as an example for description. The first voltage signal VDD_A is at a high level, the second voltage signal VDD_B is at a low level, the twelfth transistor M12 is turned on at this time, and the voltage at the fourth node PD_Aa is at a high level. During the first period T1 and the second period T2, since the voltage at the third node PU is at a high level, the fourteenth transistor M14 is turned on, and the third voltage signal VGL is controlled to be written to the fourth node PD_Aa. Due to the voltage division of the fourteenth transistor M14, the voltage at the fourth node PD_Aa is at a low level, the sixteen transistor M16 is turned off, and noise reduction is not performed on the third node PU during this period. During the reset period after the second period T2, the voltage at the third node PU is at a low level, so that the fourteenth transistor M14 is turned off, that is, the voltage division of the fourteenth transistor M14 is eliminated, and thereby the voltage at the fourth node PD_Aa increases to a high level, the sixteen transistor M16 is turned on, and noise reduction is performed on the third node PU during this period, which prevents turn-on of the ninth transistor M9 due to pulse fluctuation at the third node PU, thereby avoiding outputting a signal during the non-output period.

Figure 7:
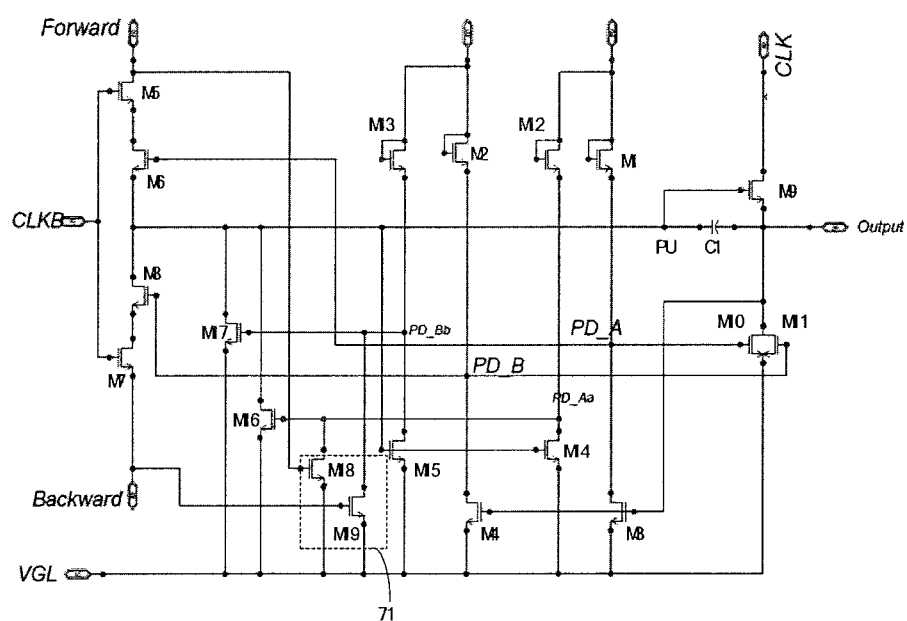
FIG. 7 illustrates a schematic structural diagram of another exemplary shift register unit according to an embodiment of the present disclosure.

In order to increase a margin of the threshold voltage Vth of the second voltage dividing sub-circuit 63, as shown in FIG. 7, the shift register unit described above may further comprise a third voltage dividing sub-circuit 71, which is electrically coupled to the first input signal terminal Forward, the second input signal terminal Reverse, the fourth node PD_Aa, the fifth node PD_Bb, and the third voltage signal input terminal VGL respectively, and is configured to write the third voltage signal VGL to the fourth node PD_Aa according to the voltage of the first input signal Forward, and write the third voltage signal VGL to the fifth node PD_Bb according to the voltage of the second input signal Reverse.

For example, the third voltage dividing sub-circuit 71 may comprise an eighteenth transistor M18 and a nineteenth transistor M19. The eighteenth transistor M18 has a gate electrically coupled to the first input signal terminal Forward, a first electrode electrically coupled to the fourth node PD_Aa, and a second electrode electrically coupled to the third voltage signal input terminal VGL; and the nineteenth transistor M19 has a gate electrically coupled to the second input signal terminal Reverse, a first electrode electrically coupled to the fifth node PD_Bb, and a second electrode electrically coupled to the third voltage signal input terminal VGL.

The forward scanning is still taken as an example for description. During the first period, the voltage input at the first input signal terminal Forward is at a high level, the eighteenth transistor M18 is turned on, and the third voltage signal VGL is written to the fourth node PD_Aa. That is, the voltage at the fourth node PD_Aa decreases due to voltage division, and therefore, the voltage at the fourth node PD_Aa is commonly controlled by the fourteenth transistor M14 and the eighteenth transistor M18, which enables a margin of a threshold voltage Vth of the fourteenth transistor M14 to increase.

Therefore, in order to prevent turn-on of the ninth transistor due to pulse fluctuation at the third node during the non-output period, the step during the third period may further comprise:

controlling to write the third voltage signal to the third node, to perform noise reduction on the third node.

For example, this step may be performed by the second controlling sub-circuit, the second voltage dividing sub-circuit, and the second noise reduction sub-circuit.

Further, in order to avoid outputting a high level signal at the output signal terminal during the non-output period, the driving method according to the embodiment of the present disclosure may comprise:

during the first period, controlling to write the third voltage signal to the output signal terminal, to perform noise reduction on the output signal terminal; and during the third period, controlling to write the third voltage signal to the output signal terminal, to perform noise reduction on the output signal terminal.

For example, this step may be performed by the first noise reduction sub-circuit.

It should be illustrated that, in the present embodiment, a type of each transistor is not limited to an N-type transistor. It may be understood that when each transistor is a P-type transistor, a timing of input signals is opposite to that of the respective signals shown in FIG. 3.

According to another aspect of the embodiments of the present disclosure, there is further provided a gate driving circuit. FIG. 8 illustrates a schematic structural diagram of a gate driving circuit 80 according to an embodiment of the present disclosure. As shown in FIG. 8, the gate driving circuit according to the embodiment of the present disclosure may comprise N stages of shift register units according to the embodiments. For a first stage of shift register unit, a first input signal Forward may be, for example, a pulse signal such as an STV frame start signal etc. For an $N^{th}$ stage of shift register unit, a second input signal Backward may be, for example, a pulse signal such as an STV frame start signal etc. Here, a first input signal terminal Forward of an $n^{th}$ stage of shift register unit $SR_n$ is electrically coupled to an output signal terminal Output of an $(n-1)^{th}$ stage of shift register unit $SR_{n-1}$, and a second input signal terminal Reverse of the $n^{th}$ stage of shift register unit $SR_n$ is electrically coupled to an output signal terminal Output of an $(n+1)^{th}$ stage of shift register unit $SR_{n+1}$, where N is an integer greater than or equal to 4, and n is an integer greater than 1 and less than N.

Figure 9:
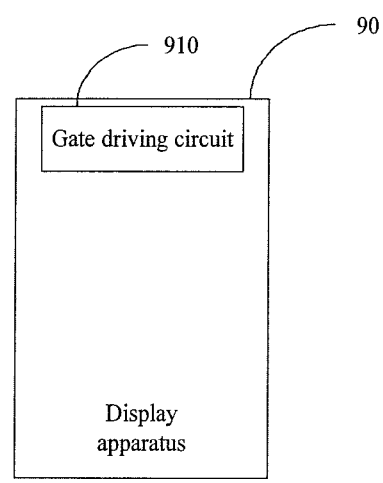
FIG. 9 illustrates a schematic structural diagram of a display apparatus according to an embodiment of the present disclosure.

According to another aspect of the embodiments of the present disclosure, there is further provided a display apparatus. As shown in FIG. 9, the display apparatus 90 may comprise a gate driving circuit 910 according to an embodiment of the present disclosure.

It should be illustrated that the display apparatus according to the present embodiment may be any product or component having a display function, such as a display panel, an electronic paper, a mobile phone, a tablet computer, a television, a notebook computer, a digital photo frame, a navigator, etc.

The embodiments of the present application provide a shift register unit, a driving method, a gate driving circuit, and a display apparatus. Here, the shift register unit comprises a first controlling sub-circuit, a first voltage dividing sub-circuit, a charging and discharging sub-circuit, and an outputting sub-circuit. A gate control voltage of the outputting sub-circuit, that is, a voltage at the third node, is controlled by the charging and discharging sub-circuit, and since voltage signals input at the first input signal terminal and the second input signal terminal electrically coupled to the charging and discharging sub-circuit are pulse signals, during a display period of one frame, the pulse signals are at a high level only during a scanning duration of one row, and are at a low level during remaining periods. Therefore, the active layer of the TFT in the charging and discharging sub-circuit may not be subjected to stress for a long time, and a negative offset of a threshold voltage of the TFT may not occur, so that the voltage at the third node, that is, a gate control voltage of the outputting sub-circuit, is maintained, thereby realizing normal output of the shift register unit.

Various embodiments in the present specification are described in a progressive manner, each embodiment focuses on differences from other embodiments, and the same or similar parts between the respective embodiments may be referred to each other.

Finally, it should also be illustrated that in this context, relational terms such as first and second etc. are used merely to distinguish one entity or operation from another entity or operation, and do not necessarily require or imply that there is any such actual relationship or order between these entities or operations. Further, terms "comprising", "including" or any other variant thereof are intended to encompass a non-exclusive inclusion, so that processes, methods, articles or devices including a series of elements include not only those elements but also other elements that are not explicitly listed, or elements that are inherent to such processes, methods, articles, or devices. In the absence of more restrictions, the elements defined by the statement "including a . . . " do not exclude the presence of additional identical elements in the processes, methods, articles, or devices that include the elements.

A shift register unit and a method for driving the same, a gate driving circuit and a display apparatus according to an embodiment of the present disclosure have been described in detail above. The principles and implementations of the embodiments of the present disclosure have been described herein with reference to specific examples. The description of the above embodiments is only to assist in understanding the method according to the embodiments of the present disclosure and its core idea. For those of ordinary skill in the art, there may be changes to the specific implementations and an application scope thereof according to the idea of the embodiments of the present disclosure. In conclusion, the present specification should not be construed as limiting the embodiments of the present disclosure.

We claim:

1. A shift register circuit, comprising:
a first controlling sub-circuit configured to receive a first voltage signal and write the first voltage signal to a first node under a control of the first voltage signal, and receive a second voltage signal and write a second voltage signal to a second node under a control of the second voltage signal;
a first voltage dividing sub-circuit electrically coupled to the first controlling sub-circuit and an outputting signal terminal, and configured to receive a third voltage signal and an outputting signal from the outputting signal terminal, write the third voltage signal to the first node under a control of the outputting signal; and write the third voltage signal to the second node under the control of the outputting signal;
a charging and discharging sub-circuit electrically coupled to the first controlling sub-circuit, the first voltage dividing sub-circuit, a first inputting signal terminal and a second inputting signal terminal, and configured to receive a first clock signal, and write a first inputting signal from the first inputting signal terminal to a third node or receive a second inputting signal from the second inputting signal terminal to the third node, under a control of the first clock signal, a voltage at the first node, and a voltage at the second node; and an outputting sub-circuit electrically coupled to the charging and discharging sub-circuit and the outputting signal terminal, and configured to receive a second clock signal and output the second clock signal at the outputting signal terminal under a control of the voltage at the third node;
wherein the charging and discharging sub-circuit comprises a forward charging and discharging sub-circuit, and a reverse charging and discharging sub-circuit,
wherein the forward charging and discharging sub-circuit comprises a fifth transistor and a sixth transistor, wherein a gate of the fifth transistor is electrically coupled to a first clock signal terminal for providing a first clock signal, a first electrode of the fifth transistor is electrically coupled to the first inputting signal terminal, and a second electrode of the fifth transistor is electrically coupled to a first electrode of the sixth transistor; and a gate of the sixth transistor is electrically coupled to the first node, and a second electrode of the sixth transistor is electrically coupled to the third node; and
wherein the reverse charging and discharging sub-circuit comprises a seventh transistor and an eighth transistor, wherein a gate of the seventh transistor is electrically coupled to the first clock signal terminal, a first electrode of the seventh transistor is electrically coupled to the second inputting signal terminal, and a second electrode of the seventh transistor is electrically coupled to a first electrode of the eighth transistor; and a gate of the eighth transistor is electrically coupled to the second node, and a second electrode of the eighth transistor is electrically coupled to the third node.

2. The shift register circuit of claim 1, wherein the first controlling sub-circuit comprises a first transistor and a second transistor, wherein
   a gate of the first transistor and a first electrode of the first transistor are electrically coupled to a first voltage signal terminal for providing the first voltage signal, and a second electrode of the first transistor is electrically coupled to the first node; and
   a gate of the second transistor and a first electrode of the second transistor are electrically coupled to a second voltage signal terminal for providing the second voltage signal, and a second electrode of the second transistor is electrically coupled to the second node.

3. The shift register circuit of claim 1, wherein the first voltage dividing sub-circuit comprises a third transistor and a fourth transistor,
   wherein
   a gate of the third transistor is electrically coupled to the outputting signal terminal, a first electrode of the third transistor is electrically coupled to the first node, and a second electrode of the third transistor is electrically coupled to a third voltage signal terminal for providing the third voltage signal; and
   a gate of the fourth transistor is electrically coupled to the outputting signal terminal, a first electrode of the fourth transistor is electrically coupled to the second node, and a second electrode of the fourth transistor is electrically coupled to the third voltage signal terminal.

4. The shift register circuit of claim 1, wherein the outputting sub-circuit comprises a first capacitor and a ninth transistor, wherein
   a first electrode of the first capacitor is electrically coupled to the third node, and a second electrode of the first capacitor is electrically coupled to the outputting signal terminal; and
   a gate of the ninth transistor is electrically coupled to the third node, a first electrode of the ninth transistor is electrically coupled to a second clock signal terminal for providing a second clock signal, and a second electrode of the ninth transistor is electrically coupled to the outputting signal terminal.

5. The shift register circuit of claim 1, further comprising:
   a first noise reduction sub-circuit configured to write the third voltage signal to the outputting signal terminal under the control of the voltage at the first node or the voltage at the second node.

6. The shift register circuit of claim 5, wherein the first noise reduction sub-circuit comprises a tenth transistor and an eleventh transistor,
   wherein
   a gate of the tenth transistor is electrically coupled to the first node, a first electrode of the tenth transistor is electrically coupled to the outputting signal terminal, and a second electrode of the tenth transistor is electrically coupled to the third voltage signal terminal; and
   a gate of the eleventh transistor is electrically coupled to the second node, a first electrode of the eleventh transistor is electrically coupled to the outputting signal terminal, and a second electrode of the eleventh transistor is electrically coupled to the third voltage signal terminal.

7. The shift register circuit of claim 1, further comprising:
   a second controlling sub-circuit configured to receive the first voltage signal and write the first voltage signal to a fourth node under the control of the first voltage signal; and receive the second voltage signal and write the second voltage signal to a fifth node under a control of the second voltage signal;
   a second voltage dividing sub-circuit configured to receive a third voltage signal, write the third voltage signal to the fourth node under the control of the voltage at the third node, and write the third voltage signal to the fifth node under a control of the voltage at the third node; and
   a second noise reduction sub-circuit configured to write the third voltage signal to the third node under a control of the voltage at the fourth node or a voltage at the fifth node.

8. A gate driving circuit, comprising:
   N stages of shift register circuits according to claim 1;
   wherein the first inputting signal terminal of the $n^{th}$ stage of shift register circuit is electrically coupled to the outputting signal terminal of the $(n-1)^{th}$ stage of shift register circuit, and the second inputting signal terminal of the $n^{th}$ stage of shift register circuit is electrically coupled to the outputting signal terminal of the $(n+1)^{th}$ stage of shift register circuit, N is an integer greater than or equal to 4, and n is an integer greater than 1 and less than N.

9. A display apparatus comprising the gate driving circuit of claim 8.

10. A method for driving the shift register circuit of claim 1, comprising:
    during a first period, writing, by the first controlling sub-circuit, the first voltage dividing sub-circuit, and the charging and discharging sub-circuit, the first inputting signal or the second inputting signal to the third node, under the control of the first inputting signal or the second inputting signal; and
    during a second period, controlling, by the outputting sub-circuit, the outputting signal terminal to output the second clock signal under the control of the voltage at the third node.

11. The shift register circuit of claim 2, wherein the first voltage dividing sub-circuit comprises a third transistor and a fourth transistor, wherein
    a gate of the third transistor is electrically coupled to the outputting signal terminal, a first electrode of the third transistor is electrically coupled to the first node, and a second electrode of the third transistor is electrically coupled to a third voltage signal terminal for providing the third voltage signal; and
    a gate of the fourth transistor is electrically coupled to the outputting signal terminal, a first electrode of the fourth transistor is electrically coupled to the second node, and a second electrode of the fourth transistor is electrically coupled to the third voltage signal terminal.

12. The shift register circuit of claim 2, wherein the charging and discharging sub-circuit comprises a forward charging and discharging sub-circuit, and a reverse charging and discharging sub-circuit,
    wherein the forward charging and discharging sub-circuit comprises a fifth transistor and a sixth transistor, wherein a gate of the fifth transistor is electrically coupled to a first clock signal terminal for providing a first clock signal, a first electrode of the fifth transistor is electrically coupled to the first inputting signal terminal, and a second electrode of the fifth transistor is electrically coupled to a first electrode of the sixth transistor; a gate of the sixth transistor is electrically coupled to the first node, and a second electrode of the sixth transistor is electrically coupled to the third node; and wherein the reverse charging and discharging sub-circuit comprises a seventh transistor and an eighth transistor, wherein a gate of the seventh transistor is electrically coupled to the first clock signal terminal, a first electrode of the seventh transistor is electrically coupled to the second inputting signal terminal, and a second electrode of the seventh transistor is electrically coupled to a first electrode of the eighth transistor; a gate of the eighth transistor is electrically coupled to the second node, and a second electrode of the eighth transistor is electrically coupled to the third node.

13. The shift register circuit of claim 3, wherein the charging and discharging sub-circuit comprises a forward charging and discharging sub-circuit, and a reverse charging and discharging sub-circuit,
wherein the forward charging and discharging sub-circuit comprises a fifth transistor and a sixth transistor, wherein a gate of the fifth transistor is electrically coupled to a first clock signal terminal for providing a first clock signal, a first electrode of the fifth transistor is electrically coupled to the first inputting signal terminal, and a second electrode of the fifth transistor is electrically coupled to a first electrode of the sixth transistor; a gate of the sixth transistor is electrically coupled to the first node, and a second electrode of the sixth transistor is electrically coupled to the third node; and
wherein the reverse charging and discharging sub-circuit comprises a seventh transistor and an eighth transistor, wherein a gate of the seventh transistor is electrically coupled to the first clock signal terminal, a first electrode of the seventh transistor is electrically coupled to the second inputting signal terminal, and a second electrode of the seventh transistor is electrically coupled to a first electrode of the eighth transistor; a gate of the eighth transistor is electrically coupled to the second node, and a second electrode of the eighth transistor is electrically coupled to the third node.

14. The shift register circuit of claim 11, wherein the charging and discharging sub-circuit comprises a forward charging and discharging sub-circuit, and a reverse charging and discharging sub-circuit,
wherein the forward charging and discharging sub-circuit comprises a fifth transistor and a sixth transistor, wherein a gate of the fifth transistor is electrically coupled to a first clock signal terminal for providing a first clock signal, a first electrode of the fifth transistor is electrically coupled to the first inputting signal terminal, and a second electrode of the fifth transistor is electrically coupled to a first electrode of the sixth transistor; a gate of the sixth transistor is electrically coupled to the first node, and a second electrode of the sixth transistor is electrically coupled to the third node; and
wherein the reverse charging and discharging sub-circuit comprises a seventh transistor and an eighth transistor, wherein a gate of the seventh transistor is electrically coupled to the first clock signal terminal, a first electrode of the seventh transistor is electrically coupled to the second inputting signal terminal, and a second electrode of the seventh transistor is electrically coupled to a first electrode of the eighth transistor; a gate of the eighth transistor is electrically coupled to the second node, and a second electrode of the eighth transistor is electrically coupled to the third node.

* * * * *